United States Patent
Lorimer (12) 
(10) Patent No.: US 6,589,878 B1
(45) Date of Patent: Jul. 8, 2003

(54) METHOD OF CLEANING A WAFER IN AN IC FABRICATION

(76) Inventor: D'Arcy Harold Lorimer, 230 Houston Way, Pismo Beach, CA (US) 93449

(*) Notice: Subject to any disclaimer, the term of this patent is extended or adjusted under 35 U.S.C. 154(b) by 0 days.

(21) Appl. No.: 10/202,950

(22) Filed: Jul. 24, 2002

Related U.S. Application Data (62) Division of application No. 09/166,819, filed on Oct. 5, 1998, now Pat. No. 6,460,552.

(51) Int. Cl.$^7$ .................. H01L 23/02; H01L 23/10; H01L 23/34; H01L 23/48; B08B 6/00
(52) U.S. Cl. .................. 438/704; 438/706; 438/714; 438/715; 438/745; 134/1.2; 134/1.3; 134/3
(58) Field of Search .................. 438/68, 64, 113, 438/112, 115, 704, 706, 715, 714; 134/1.2, 1.3, 3; 216/58, 91, 108

(56) References Cited

U.S. PATENT DOCUMENTS

| | | | |
|---|---|---|---|
| 4,079,522 A | * | 3/1978 | Ham |
| 5,232,511 A | * | 8/1993 | Bergman |
| 5,716,457 A | * | 2/1998 | Hayes et al. |
| 5,928,434 A | * | 7/1999 | Goenka |
| 5,964,952 A | * | 10/1999 | Kunze-Concewitz |
| 6,225,191 B1 | * | 5/2001 | Ahlquist et al. |

FOREIGN PATENT DOCUMENTS

JP        08236497 A   *   9/1996

* cited by examiner

Primary Examiner—Ha Tran Nguyen (57) ABSTRACT

A semiconductor deposition system in accordance with the present invention includes a CMP apparatus operative to planarize an active surface of a semiconductor wafer, and a wafer cleaner for cleaning wafer after the CMP process. The wafer cleaner preferably includes a wafer rotating mechanism, a steam inlet for applying steam to the active surface of the wafer as it is rotated and a liquid inlet for simultaneously applying a liquid to the back side surface of the wafer. A method for manufacturing an integrated circuit in accordance with the present invention includes subjecting an active surface of the wafer to a plurality of processes selected from a group including deposition, patterning, doping, planarization, ashing and etching, and steam cleaning the active surface at least once before, during, and after the plurality of processes. Preferably, an aqueous vapor phase is applied to the first surface of the wafer as an aqueous liquid phase is applied to the other surface of the wafer. Spinning the wafer urges condensate from the vapor phase to move toward the edge of the wafer as the wafer surfaces are cleaned.

18 Claims, 10 Drawing Sheets

METHOD OF CLEANING A WAFER IN AN IC FABRICATION

CROSS REFERENCE TO RELATED APPLICATIONS

This application is a divisional application of copending application Ser. No. 09/166,819 filed Oct. 5, 1998 U.S. Pat. No. 6,460,552 entitled METHOD AND APPARATUS FOR CLEANING FLAT WORKPIECES, and claims benefit thereof.

BACKGROUND OF THE INVENTION

This invention relates generally to semiconductor manufacturing systems, more particularly to cleaning apparatus forming a part of semiconductor manufacturing systems, and most particularly to high-purity cleaning systems for flat workpieces.

The production of integrated circuits requires very clean systems and processes. This is because integrated circuits and other semiconductor devices often have line-widths in the submicron range. Even very tiny particles adhering to the surface of a semiconductor wafer during the integrated circuit manufacturing process have the potential of destroying the functionality of integrated circuits on the wafer. The semiconductor manufacturing industry therefore goes to great lengths to keep the semiconductor manufacturing equipment, and the surrounding environment, in a very clean condition.

Semiconductor manufacturing is typically accomplished within "clean rooms" which are categorized by "Class." For example, a Class 100 clean room will have no more than 100 airborne particles of a certain size per cubic foot. A Class 10 clean room will have only 10 such particles per cubic foot, a Class 1 clean room will have only 1 particle per cubic foot, etc. In modern semiconductor manufacturing plants, Class 1 clean rooms are often used.

Integrated circuits are typically formed in multiple copies on a single semiconductor wafer. This semiconductor wafer used most frequently is made from a very pure silicon material; and are typically 6–12 inches in diameter. These wafers, as received from the manufacturer, are very clean. They may, for example, have fewer than a dozen particles of a given sub-micron size per wafer. Ultimately, these wafers are processed by a series of deposition, masking, etching, implantation, etc. operations in order to form a number of integrated circuits on a surface. The wafer is then cut into "die", each of which includes a single integrated circuit chip. Operative die are packaged and sold as the final integrated circuits.

The "yield" from a semiconductor wafer is defined as the total number of operative die divided by the total number of die on the wafer. The cost-per-integrated circuit is directly related to the yield of the wafer. Since a leading cause of inoperative die are particles that were present on the surface of the wafer during the manufacturing process, it is imperative to keep the wafer surface as clean as possible during the manufacturing process.

Unfortunately, many of the processes to which a wafer is exposed during the manufacturing process are inherently dirty. For example, an etching process can create a large number of particles on the surface of a wafer. As another example, chemi-mechanical polishing (CMP), which is increasingly used to replace isotropic etching processes, uses chemicals and fine particles to grind the surface of a wafer. Chemi-mechanical polishing is also sometimes referred to as "chemi-mechanical planarization", since it is often used for planarization purposes. It will therefore be appreciated that CMP processes generate a great many particles on the surface of the wafer which must be removed to maintain a reasonable yield from the wafer.

The prior art teaches a number of methods for cleaning wafers. The most common is an aqueous or chemical bath into which the wafer is dipped. However, these "wet" or "dip" processes have a number of deficiencies. For one, wet processes are generally incompatible with cluster tool processing. Wet cleaning processes have traditionally been batch processes where a group or batch (usually 25) wafers was cleaned, rinsed, and dried together in a cassette. Since cluster tools process wafers singly (in series), wafers from cluster tools must be loaded into cassettes and then transported to cleaning areas by human operators. This requires that the wafers be loaded into plastic cassettes that are placed into dip tanks for chemical processing. These cassettes are then placed into spin/rinse dryers for final rinsing and drying. This process consumes time, costs money, and exposes the wafers to the possibility of contamination during transport. As wafer sizes get larger, the transportation and handling of wafers in cassette batches becomes much more difficult and less practical.

To aid in the removal of particles, traditional wet cleaning equipment has used ultrasonic (or Megasonic) high frequency agitation, rotating brushes, or high velocity liquid jets. High frequency agitation has been proven effective at removing particles, but the difficulty lies in preventing redeposit of particles from the solution once the ultrasound energy stops. Since the wafer must often be removed from the solution through a gas liquid interface, it must be removed through a zone where particles may concentrate, recontaminating the wafer upon exit. To avoid this, it has been proposed to provide continuous liquid flow at the interface, but high overflow rates are required to keep particle counts low and this may result in excessive water or chemical consumption.

Rotating brushes have also been used, where the bristles have been chemically treated to modify solution Zeta potential, therefore attracting particles from the wafer surface to the brush. However, for these to work, the nature of the particles must be such that they are attracted to the charge on the brushes. In addition, cleaning the brushes may be critical since dirty brushes (having accumulated a lot of particles) will eventually recontaminate the wafer surfaces, reducing cleaning effectiveness. Liquid jets must be very high velocity in order to result in a fluid boundary layer on the order of the particle sizes (well below 0.5 micron). These high velocities can damage surfaces due to erosion, especially with patterned substrates with various surface topography.

Wet processes do not tend to be very effective at removing all particles, and will actually add particles to the surface of the wafer when the cleaning solution becomes dirty. In addition, the aqueous or liquid phase contains particles that are about 3 orders of magnitude higher (per cubic meter) than those found in the gas phase. This is in part due to the fact that filtration technology is about two to three orders of magnitude less effective for the liquid phase than for the gas phase. Further, even the purest of water has the propensity to grow contaminating microorganisms. Because of these factors, there has been a dedicated focus for many years on "dry" processing utilizing gas phase processes.

The number of particles added to a wafer by the solution is dependent on the concentration equilibrium between the particles in the solution immediately in contact with the wafer and those on the surface. Soaps and surfactants will effectively reduce the "apparent" particle concentration by tying or solvating the particles to organic components in solution. Soaps are not widely used in the semiconductor industry for cleaning of high purity Si wafers because these same surfactants will also contaminate the wafer surfaces. In the case of very dirty wafers and very clean solutions, there will be a tendency for particles to move into solution (assuming charge effects and solution chemistry permits this). In the case of clean wafers and dirty solutions, the opposite can occur. The ultimate baseline test of a cleaning system is to measure particles added to or removed from "virgin prime" substrates which have very few particles on their surface. The better the cleaning system, the fewer the particle adders will be seen.

A typical commercial wafer cleaning apparatus (such as a spin rinse dryer) will always add particles to prime substrates, even when using ultra pure deionized water. This is because, no matter how pure the water source, there is always present particle and bacterial contamination. Only the very sophisticated and highly proprietary final cleaning processes used by the original equipment manufacturers (OEMs) of the silicon substrates, i.e. the wafer manufacturers themselves, can actually remove particles from prime quality wafers. These processes are too complex and expensive to be used in the production fabs.

For the foregoing reasons, wet wafer process cleaning has always been deemed by production fabs as a necessary evil, and for many years effort was focused on developing so called dry cleaning processes which used reactive gasses and plasmas to try and remove particle contaminates. With the advent of CMP, the practicality of using dry processes to remove large levels of contamination has been considerably reduced.

The use of high purity steam has some potential advantages when compared to conventional wet cleaning. If done correctly, high purity water can be vaporized into a high purity gas (steam), then condensed directly onto the wafer surface. UHP steam is potentially devoid of any ions and contaminates, including bacteria and particles, and will be a very aggressive solvent for surface contaminants. However, it is very important that adequate amounts of steam are applied to the wafer surface, and that the contaminants are flushed uniformly from the surface. Condensing steam at 1 atmosphere pressure will also raise the wafer temperature to nearly 100° C., making residue free drying a possibility.

The prior art has taught the possibility of using steam to clean silicon wafers for a number of years. For example, U.S. Pat. No. 4,186,032 and U.S. Pat. No. 4,079,522, mention the use of an inclined heat sink to process wafers one at a time by condensing steam on the wafer surface and allowing the condensate to drain off by gravity. However, this method will not produce uniformly clean wafers due to the fixed orientation of the wafer being cleaned, resulting in potential particle gradients bottom to top. Further, the process as described is quite lengthy, requiring many minutes per wafer. In addition, the technique has no provision for backside cleaning (i.e. the cleaning of the surface of the wafer opposite from the active surface of the wafer) that would not recontaminate the front surface. There is also no mention of purifying the steam prior to condensation, which is critical for particle free performance, since steam (like any gas) can contain aerosols and particles that will contaminate the wafer surface upon condensation.

The prior art discloses the use of steam or condensing water vapor to clean silicon wafers. Typically, such prior art discloses the contact of a wafer cassette or single wafer with saturated steam. The prior art therefore typically ignores the requirement to provide adequate "heat sinking" behind the wafer to condense sufficient steam to clean. Without the heat sink, only enough steam will condense to raise the temperature of the wafer from its input temperature to 100° C., e.g. only a few cubic cm. To condense sufficient quantities of water for adequate cleaning, on the order of a 100–200 cc/min of condensate, a heat sinking of many kilowatts is required. This is perhaps the reason condensing steam has not been utilized for conventional batch cassette processing. It is not easy or practical to heat sink each wafer adequately in a cassette.

It would therefore be desirable to have a cleaning method and apparatus which is both more effective than cleaning methods and apparatus of the prior art and which can become an integral part of a semiconductor manufacturing system.

SUMMARY OF THE INVENTION

One aspect of the present invention applies filtered, high purity steam to an active surface of a wafer to clean particles from the active surface. Preferably, a relatively cooler liquid is simultaneously applied to the back of the wafer to heat sink the large heat of vaporization and provide backside cleaning. Due to the elevated temperature produced by the condensing steam, the wafer can be dried quickly in situ. Because the invention does not use the "wet" batch (cassette) cleaning technology of the prior art, the clean wafer can exit from the system in a dry state, enabling a "dry in/dry out" single wafer processing strategy. Consequently, the cleaning apparatus of the present invention can be tightly integrated and form a part of a semiconductor processing system.

In one aspect of the present invention, a semiconductor processing system includes at least one semiconductor fabrication process apparatus operative to perform a semiconductor fabrication process on a surface of a semiconductor wafer, and a wafer cleaning device for cleaning the wafer surface preceding or subsequent to the semiconductor fabrication process. Such semiconductor fabrication processes include thermal oxidation, chemical vapor deposition, epitaxial deposition, physical vapor deposition, copper deposition, etch, or chemi-mechanical polishing. Preferably, the wafer cleaning device includes a wafer rotating mechanism, a steam inlet for applying steam directly to an active surface of a rotating wafer, and a liquid inlet for simultaneously applying a liquid to the backside of the wafer. In one embodiment, one or more wafer cleaning devices may be part of a cluster tool sharing a common transfer chamber and a common wafer transport arm with single or multiple semiconductor fabrication process apparatus. In another embodiment, one or more wafer cleaning devices may reside by themselves on a cluster tool separate from the cluster tool to which the semiconductor fabrication process apparatus are attached.

The present invention further includes a method for manufacturing an integrated circuit including subjecting an active surface of a wafer to a plurality of processes, and cleaning the active surface of the wafer before, during, or after the plurality of processes. As used herein, the term "plurality of processes" refers to two or more processes selected from a group including thermal oxidation, deposition, patterning, doping, planarization, etching, and ashing processes. For example, the planarization process can be a chemi-mechanical polishing (CMP) process. Cleaning the wafer further includes rotating the wafer, applying a vapor phase to the active surface at a first temperature, and applying a second liquid to the backside surface at a second temperature lower than the first temperature. The vapor phase may include steam, mixtures of steam and isopropyl alcohol, or mixtures of steam and hydrogen chloride, hydrogen fluoride, hydrogen bromide, and ammonia. The vapor phase may be filtered prior to application to the wafer surface. After subjecting the active surface to the plurality of front end semiconductor manufacturing processes, the wafer is cut into a plurality (i.e. two or more) of integrated circuit die, and the die are packaged to form a plurality of integrated circuits.

A work piece cleaning system in accordance with the present invention includes a work piece holder including a plurality of work piece gripping members, a rotator mechanism coupled to the gripping members to rotate the work piece, a vapor phase inlet positioned to apply a vapor phase at a first temperature to a first surface of the work piece, and a liquid phase inlet positioned, to apply a liquid phase at a second temperature lower than the first temperature to a second surface of the work piece. The liquid phase cools the work piece such that there is substantial condensation of the vapor phase when it contacts the first surface of the wafer. Preferably, the system further includes a liquid supply, and a vapor phase generator and filter coupling the vapor generator to the cleaning chamber. The liquid supply preferably comprises deionized water, and/or isopropyl alcohol solution, or other suitable aqueous and non-aqueous cleaning agents.

A work piece cleaning system in accordance with other aspects of the present invention includes a supply of an aqueous solution, a steam generator coupled to the supply of aqueous solution and operative to generate a vapor phase of the aqueous solution, a filter coupled to the steam generator to filter the vapor phase, a rotating wafer holding mechanism, and a nozzle coupled to the filter to direct the vapor phase to a surface of the wafer that is held and rotated by the wafer holding mechanism. Some of the vapor phase becomes liquefied upon contacting the wafer, and is urged outwardly toward the edge of the wafer by the rapid rotation of the wafer. Preferably, a liquid phase of an aqueous solution is applied to the other surface of the wafer to clean the backside of the wafer and to cool the wafer to aid in the condensation process. An ultrasonic transducer or other vibration mechanism can be coupled to the system to further aid in the cleaning process.

An advantage of the present invention is that it can be characterized as a "dry" process, even though various fluids are applied to the wafer during the cleaning process. This is because the wafer is heated during the cleaning process, and can be removed from the cleaning system in a dry state. As such, it can form an integral part of a semiconductor manufacturing apparatus, such as a cluster tool.

Another advantage of the invention is that the active side and the back side of the wafer can be cleaned simultaneously. This is advantageous in that processes of the prior art that only clean the active side of the wafer leave particles and residue on the back side of the wafer that can, itself, become a source of contamination for the active side.

A still further advantage of using a vapor phase, such as steam, to clean the active side of a wafer is that it is an inherently cleaner process than the wet clean processes of the prior art. This is due, in great part, to the extremely high purity that can be achieved with steam, especially when it is passed through a filter in its vapor phase. As such, the steam cleaning agent introduces virtually no particles or contaminants to the surface of the wafer.

These and other advantages of the present invention will become apparent to those skilled in the art upon a reading of the following descriptions of the invention and a study of the several figures of the drawing.

BRIEF DESCRIPTION OF THE DRAWINGS

FIG. 1b is a flow diagram of a manufacturing process of the present invention that can be implemented with the system illustrated in FIG. 1a;

DETAILED DESCRIPTION OF THE PREFERRED EMBODIMENTS

Figure 1A:
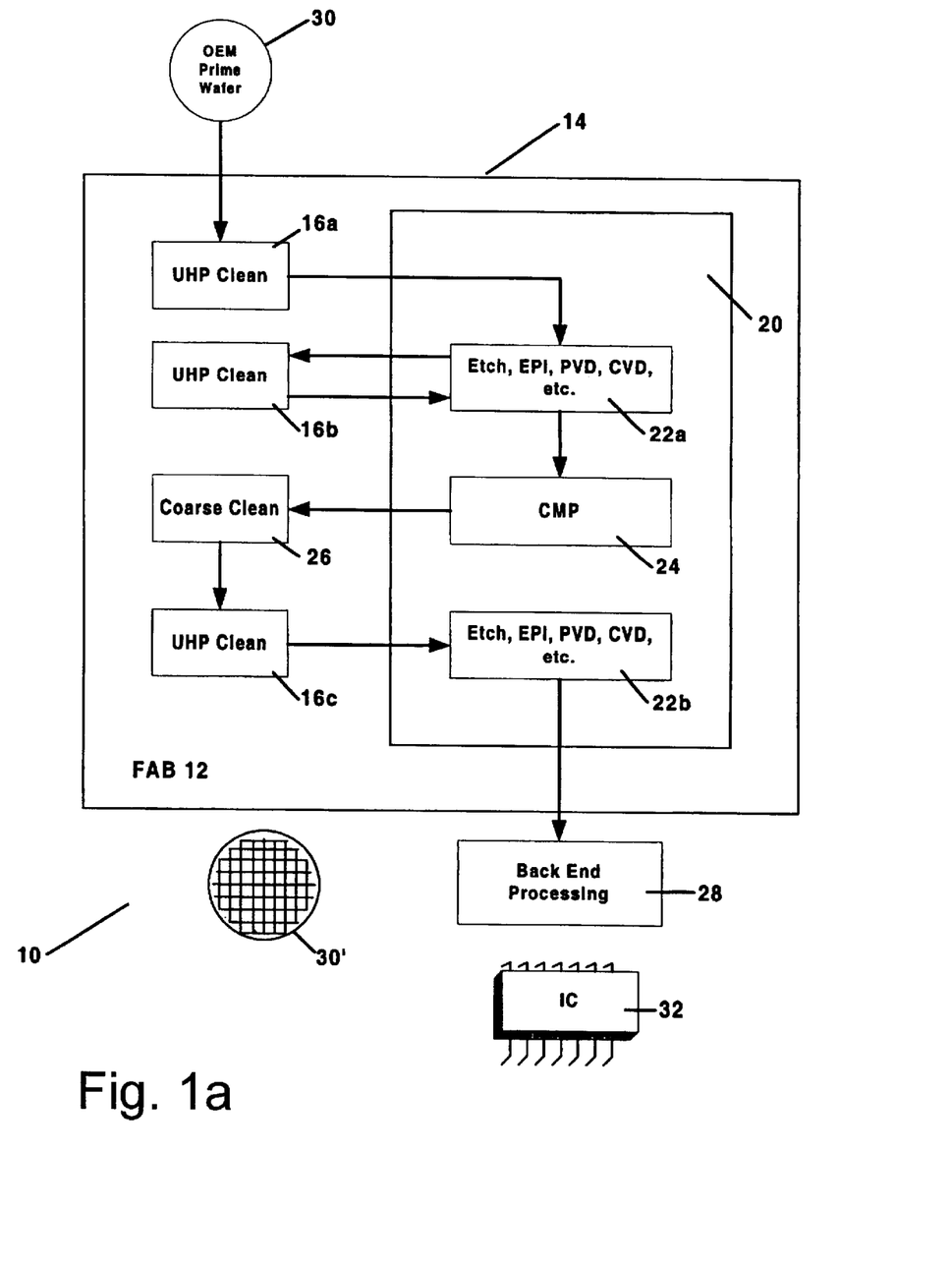
FIG. 1a is a block diagram view of a manufacturing system for making integrated circuits in accordance with the present invention.

In FIG. 1a, a semiconductor manufacturing system 10 includes a fabrication facility or "fab" 12 including a number of semiconductor processing apparatus and tools. Typically, the fab 12 is enclosed within a clean room 14, e.g. a Class 10 or Class 1 clean room. The fab 12 includes one or more Ultra High Purity (UHP) wafer cleaners 16 (e.g. 16a, 16b, 16c) in accordance with the present invention in addition to front end processing apparatus 20. As used herein, "front end" processing apparatus include systems, machines, apparatus, tools, etc. which operate at the wafer level to perform such functions as thermal oxidation, deposition, etch, photolithography, chemi-mechanical polishing (CMP), etc.

As is well known to those skilled in the art, a series of front end processing operations are used to build the multiple layers of an integrated circuit structure. Some of these front end processing equipment are shown generically in blocks 22 (e.g. 22a, 22b), while a particular front end processing apparatus is illustrated by CMP apparatus 24. Also illustrated is a "coarse clean" apparatus 26 that is inserted into the process flow between CMP apparatus 24 and an UHP cleaning apparatus 16a. This "coarse clean" apparatus can be a "wet", "dip" or brush cleaning apparatus as described previously, wherein one or more wafers are dipped into a vat of liquid cleaning solution or cleaned with brushes and liquid sprays. The coarse clean can also be an integrated module in the CaM machine itself, and/or a part of a cluster tool.

The semiconductor manufacturing system 10 may further include a backend processing system 28. As used herein, "backend processing" includes systems, machines, apparatus, tools, etc. involved in the finishing work of manufacturing integrated circuits. Such backend processing systems includes the saws for cutting a process wafer into individual die, apparatus for testing the wafer in the die, apparatus for wire and packaging the die, etc.

A process for making an integrated circuit in accordance with the present invention is as follows. A semiconductor (usually silicon) wafer 30 is obtained from a wafer manufacturer. As noted previously, these wafers are provided in a very clean state, and are often referred to as "OEM Prime Virgin" wafers. Nevertheless, these wafers may have particles that need removing. The wafers 30 are entered into the fab 12 (typically through an air or load lock), and may be cleaned in a first Ultra High Purity (UHP) clean apparatus 16a. From there, the wafer 30 progresses through a number of front end processing apparatus forming a part of the front end processing system 20. For example, the wafer 30 may be processed through one or more thermal, etch, epitaxial ("epi"), physical vapor deposition ("PVD"), etc. semiconductor processing systems 22a, and may be passed through an UHIP cleaner 16b at various times during these processes.

Chemi-mechanical polishing (CMP) is becoming an increasingly popular method for planarizing and etching layers during semiconductor manufacturing. The CMP apparatus 24, however, generates a large number of particles on the wafer 30 that must be removed prior to further processing. These particles are produced by the combination of chemical and abrasive actions caused by the CMP process. It is therefore desirable to have a first or "coarse" clean in an apparatus 26 immediately after a CMP operation.

A problem with simply cleaning a wafer 30 within a coarse cleaner 26 after a CMP operation is that there are still many particles left on the active and back surfaces of the wafer. Therefore, a UHP cleaning operation of the present invention is performed in a UHP clean apparatus 16c after the wafer 30 has been cleaned within the coarse cleaning apparatus 26. After the cleaning within the UHP cleaning apparatus 16c, additional semiconductor manufacturing operations such as etch, PVD, chemical vapor deposition ("CVD"), etc. can be performed within the semiconductor processing systems 22b.

After the completion of the front end processing, a processed wafer 30' is typically removed from the fab 12 to other locations for further processing. As noted earlier, the "backend" processing system 28 performs such functions as testing the wafer 30', cutting the wafer into individual integrated circuits die, packaging the die, etc. The end result of the semiconductor manufacturing system 10 is to produce a number of integrated circuits, shown generally at 32, from the wafers 30 passing through the system.

Figure 1B:
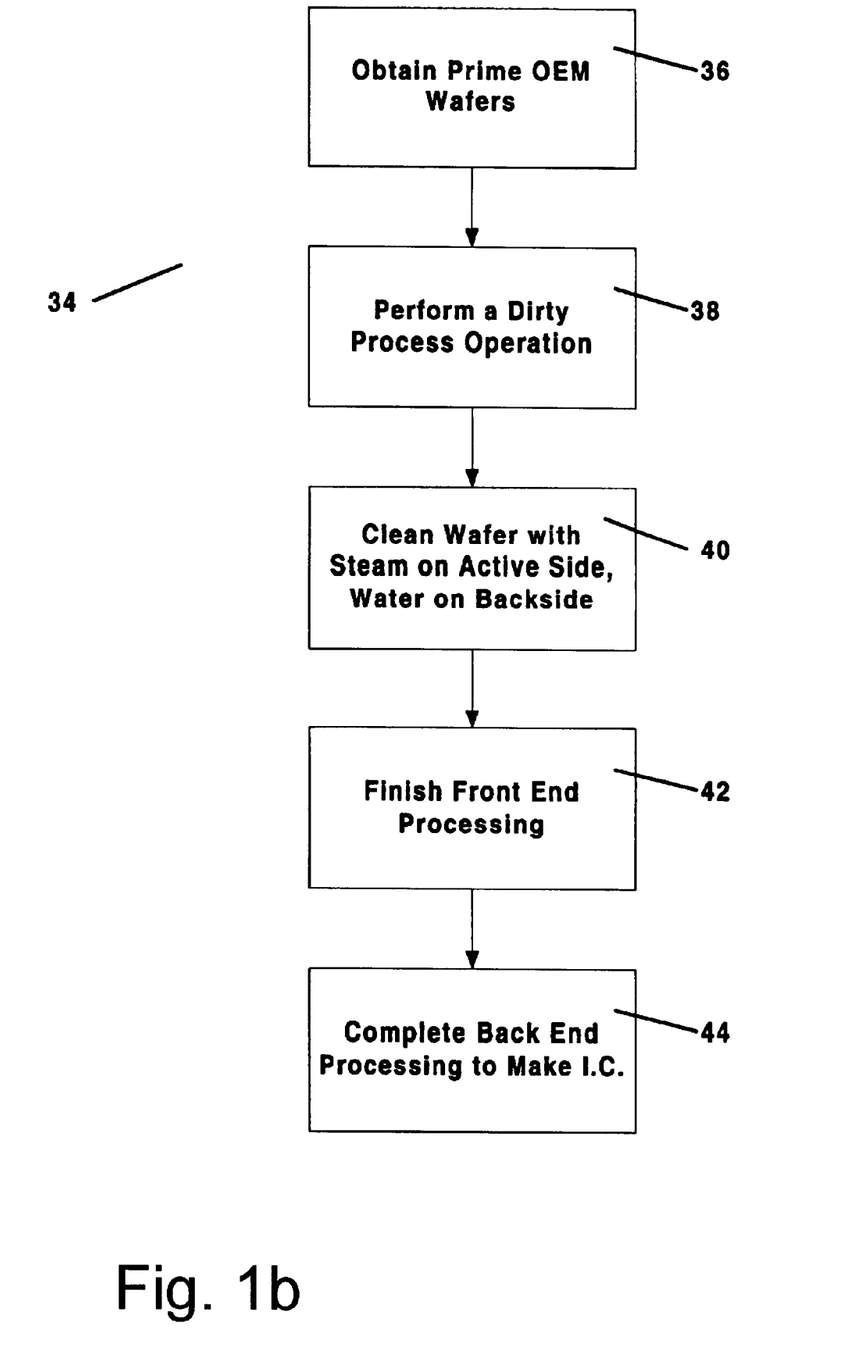

FIG. 1b summarizes a process 34 for making integrated circuits in accordance with the present invention. The process 34 begins with the obtaining of prime OEM wafers in an operation 36, and a "dirty" processing operation 38 is performed. This dirty processing operation is performed in one of the aforementioned semiconductor manufacturing apparatus, or in other tools or environments related to the fabricated process, as will be appreciated by those skilled in the art. However, it should be noted that some processing operations are "dirtier" than other processing operations, and that cleaning may not be required after every operation which may leave some particles or other contaminants on the wafer surfaces.

After the performing of the dirty processing operation 38 the wafer is cleaned with in a UHP clean apparatus of the present invention. Preferably, the wafer is cleaned with steam on the active side of the wafer, and deionized water on the back side of the wafer in an operation 40. Isopropol alcohol ("IPA") can be added to the steam, the deionized water, or both, to aid in the cleaning process. Concentrations of between 0.1 to 25 volume % EPA are suitable. Next, in an operation 42, the back end processing is completed. Operation 44 accomplishes the front end processing of the wafer to result in one or more packaged integrated circuits.

Figure 2A:
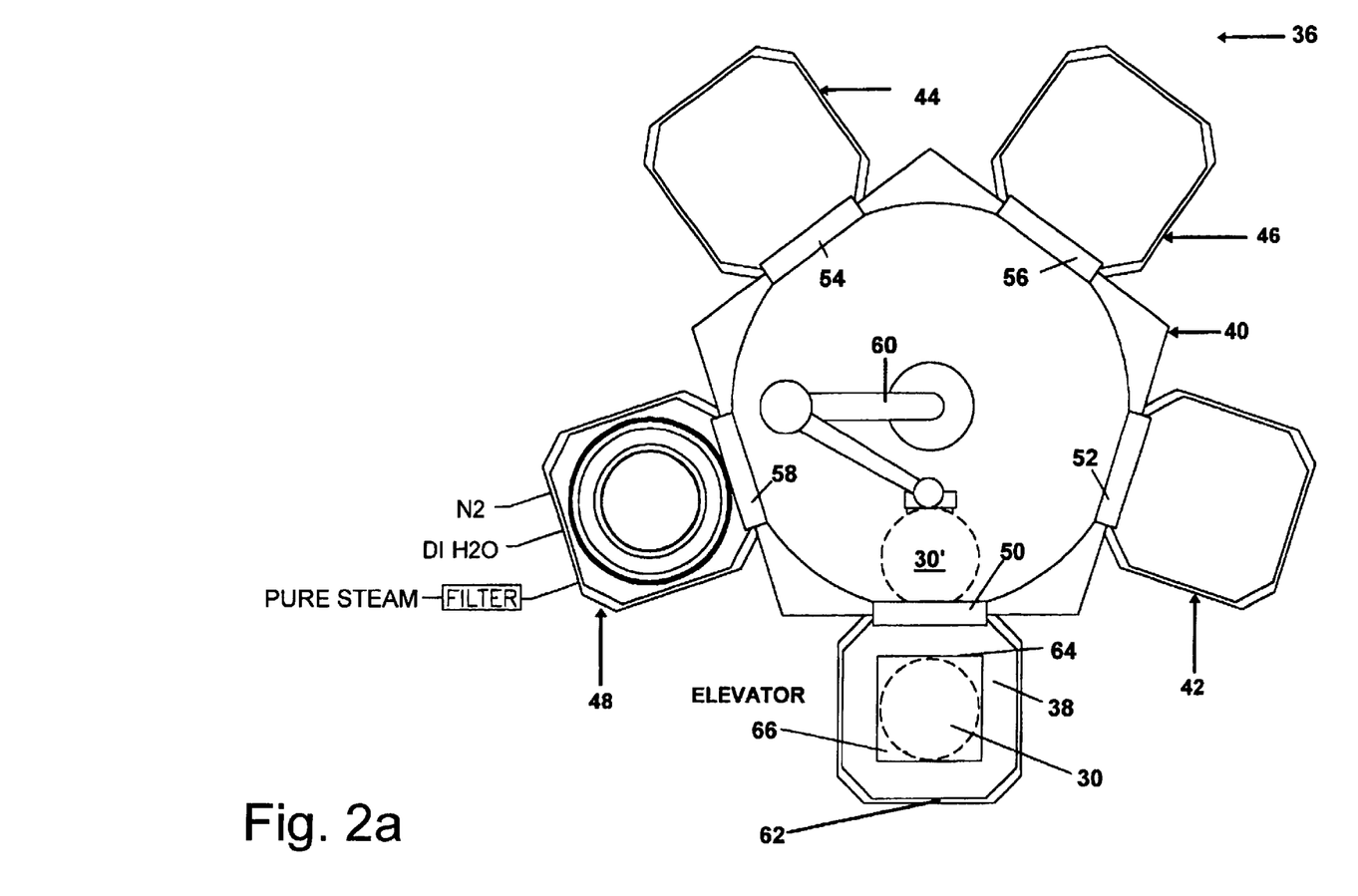
FIG. 2a is a diagram illustrating the operation of a semiconductor processing cluster tool in accordance with the present invention.

In FIG. 2a, a semiconductor manufacturing apparatus 36 is in the form of a cluster tool including a number of chambers. More particularly, the cluster tool 36 includes a load station 38, a robot chamber 40 and a number of processing chambers 42, 44, 46, and 48. The transfer chamber 38 and the processing chambers 42–48 are coupled to the robot chamber 40 by slit or gate valves 50–58, respectively. A robot arm assembly 60 within the robot chamber 40 is used to transfer wafers between the various chambers 38–48. The design and operation of cluster tools of the type of cluster tool 36 is well known to those skilled in the art.

Load station 38 includes a door 62 which can opened to a load cassette 64 including a number of wafers 30. The cassette 64 is preferably placed on top of an elevator 66 within the transfer chamber 38 so that it can be moved vertically up and down (i.e. into and out of the plane of the paper in this figure). The load station 38 can be operated at atmospheric pressure or under vacuum. If operated at atmospheric pressure, the load station is preferably purged with dry, filtered nitrogen or filtered air via a hepa filter placed above the cassette 64 (not shown). In other embodiments of the invention, the cluster tool operates at absolute pressures lower than atmospheric, and can be evacuated by a vacuum system (not shown).

To begin processing the wafers within the cassette 64, the slit or gate valve 50 is opened and the robot arm 60 removes one of the wafers 30 from the cassette 64. This is accomplished by properly coordinating the movements between the robot arm assembly 60 and the vertical position of the cassette 64 as controlled by the elevator 66. The design and use of robot wafer transfer systems is well known to those skilled in the art.

Once a wafer 30 has been removed from the cassette 64 and is within the robot chamber 40 as illustrated at 30' it can be placed within a first processing chamber 42 by opening the gate valve 52. The gate valve 52 is then closed to allow the wafer 30 to be processed within the chamber 42. The wafer then can be removed from the processing chamber 42 and inserted into, for example, a CMP chamber 44 for chemi-mechanical polishing. The robot movement of the wafer is accomplished as described previously, i.e. opening the appropriate gate valve leaving the wafer behind the chamber and closing the gate valve for subsequent processing.

It is assumed that the wafer leaves the CMP process chamber 44 in a reasonably clean state, i.e. with less than 200–500 particles per wafer, to prevent contamination of the robot transfer components. This contamination may degrade the performance of the UHP cleaning chamber 48 by contaminating wafers as they are removed. It is common to find "coarse" cleaning modules attached to the dirtier CMP process units, and if needed, these modules are assumed to be part of chamber 44. As will be discussed in greater detail subsequently, the chamber 48 is provided with nitrogen (N2), deionized (DI), water, and filtered steam to support the UHP cleaning process.

After being cleaned within the UHP cleaning chamber 48 of the present invention, the wafer can be removed from a chamber 48 and replaced within the cassette 64 to be transferred to other apparatus. Therefore, the cluster tool 36 provides a processed, clean and dry wafer suitable for additional processing.

There, of course, may be other suitable configurations for the process chambers illustrated in FIG. 2a. For example, chambers 42, 44, or 46 can be photoresist strip chambers or more CMP or UHIP steam cleaning chambers. Having multiple chambers on the same cluster tool can be advantageous for increased wafer throughput.

It should be noted that while, in the forgoing example, the UHP cleaning system is show to be a part of a cluster tool, that the UHP cleaning system can also be a stand-alone apparatus. That is, the cleaning system does not need to be integrated with other processing chamber, and can provide single or multiple wafer cleaning by utilizing the cleaning processes of the present invention. The UHP cleaning system of the present invention can also be implemented with multiple chambers in a cluster tool. That is, a plurality (i.e. two or more) UHP cleaning chambers can be provided on a single cluster tool to increase cleaned wafer throughput.

Figure 2B:
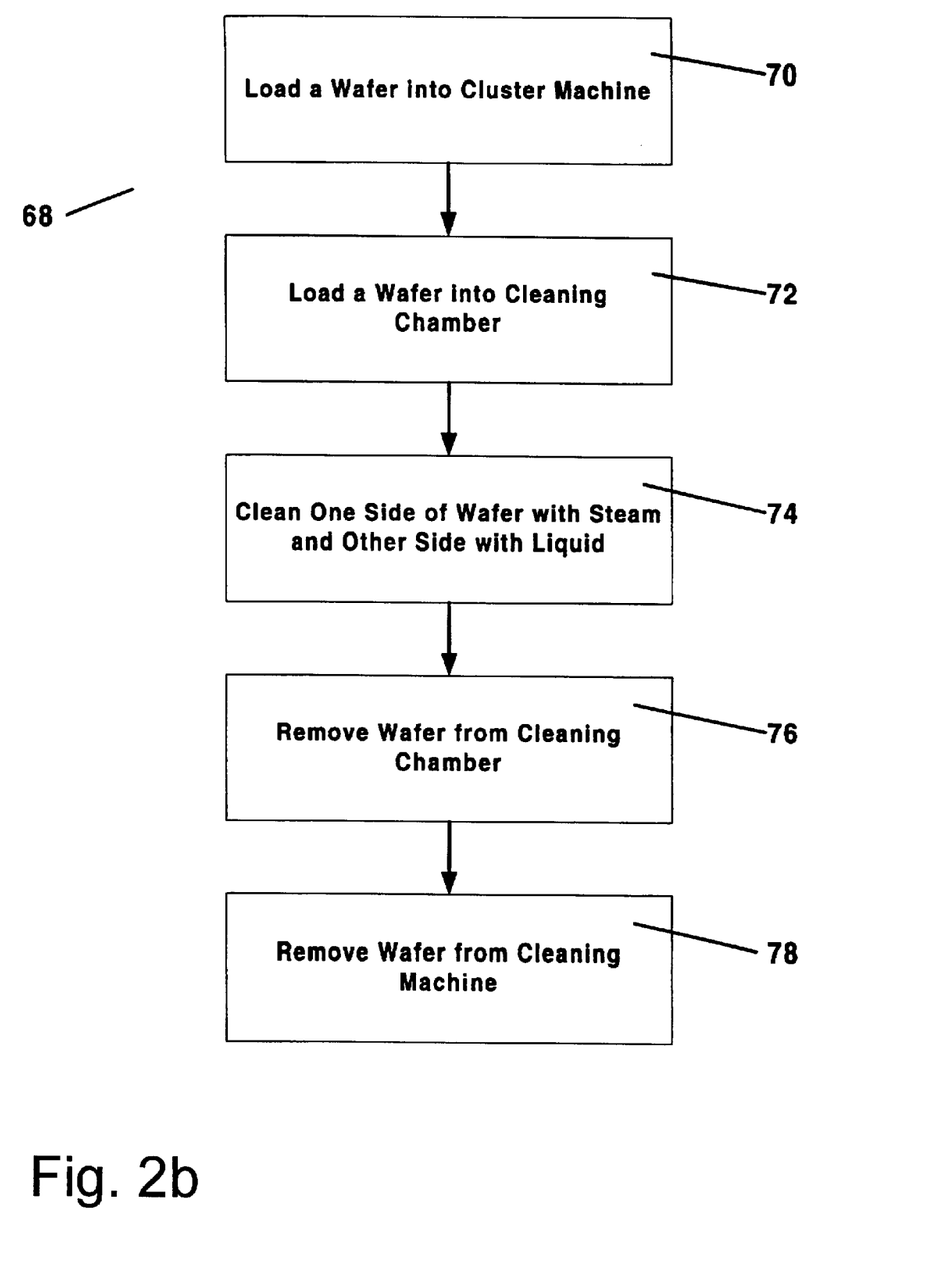
FIG. 2b is a flow diagram of a process for operating the cluster tool of FIG. 2a in accordance with the present invention.

In FIG. 2b, a process 68 that can be implemented by the cluster tool 36 is illustrated in flow-diagram form. The process 68 begins at 70 with the loading of a wafer into a cluster machine. The wafer is then loaded into a cleaning chamber in an operation 72, and operation 74 cleans one side of the wafer with steam and the other side with water. The wafer is then removed from the cleaning chamber in operation 76 and is removed from the cluster tool in an operation 78.

Figure 3:
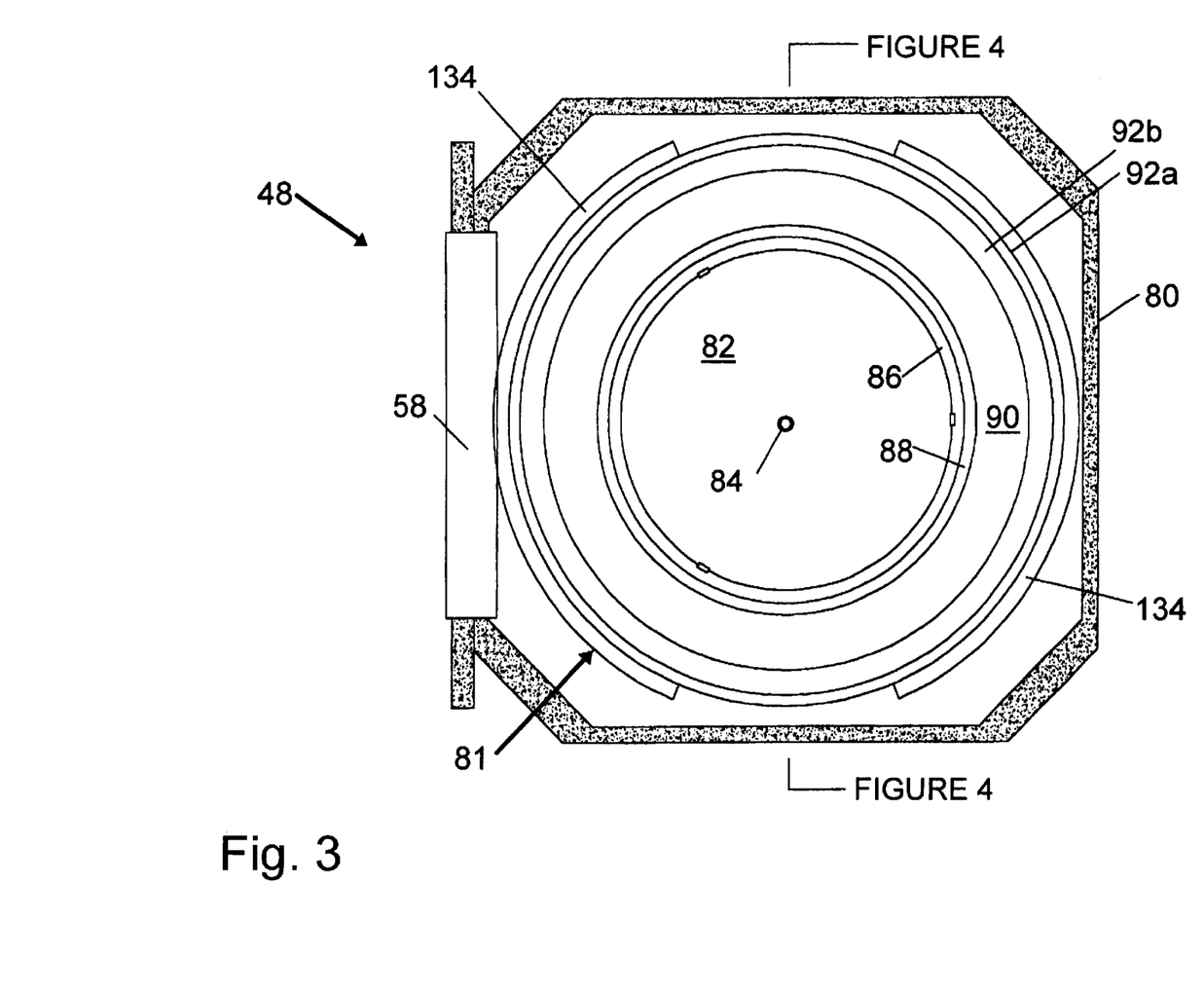
FIG. 3 is a partially sectioned, top plan view of a wafer cleaner in accordance with the present invention.

In FIG. 3, a partially sectioned top plan view of the chamber 48 of FIG. 2a is illustrated in greater detail. The chamber includes an outer enclosure 80 made from, for example, welded aluminum. Within the chamber 48 is a cleaning apparatus 81 including a chuck 82 having a steam inlet 84, a annular passage 86, and annular a lip 88, and an annular outlet or drain 90. The top portion of the chamber 48 is not illustrated in this figure, but can be viewed in cross-section in FIG. 4.

Figure 4:
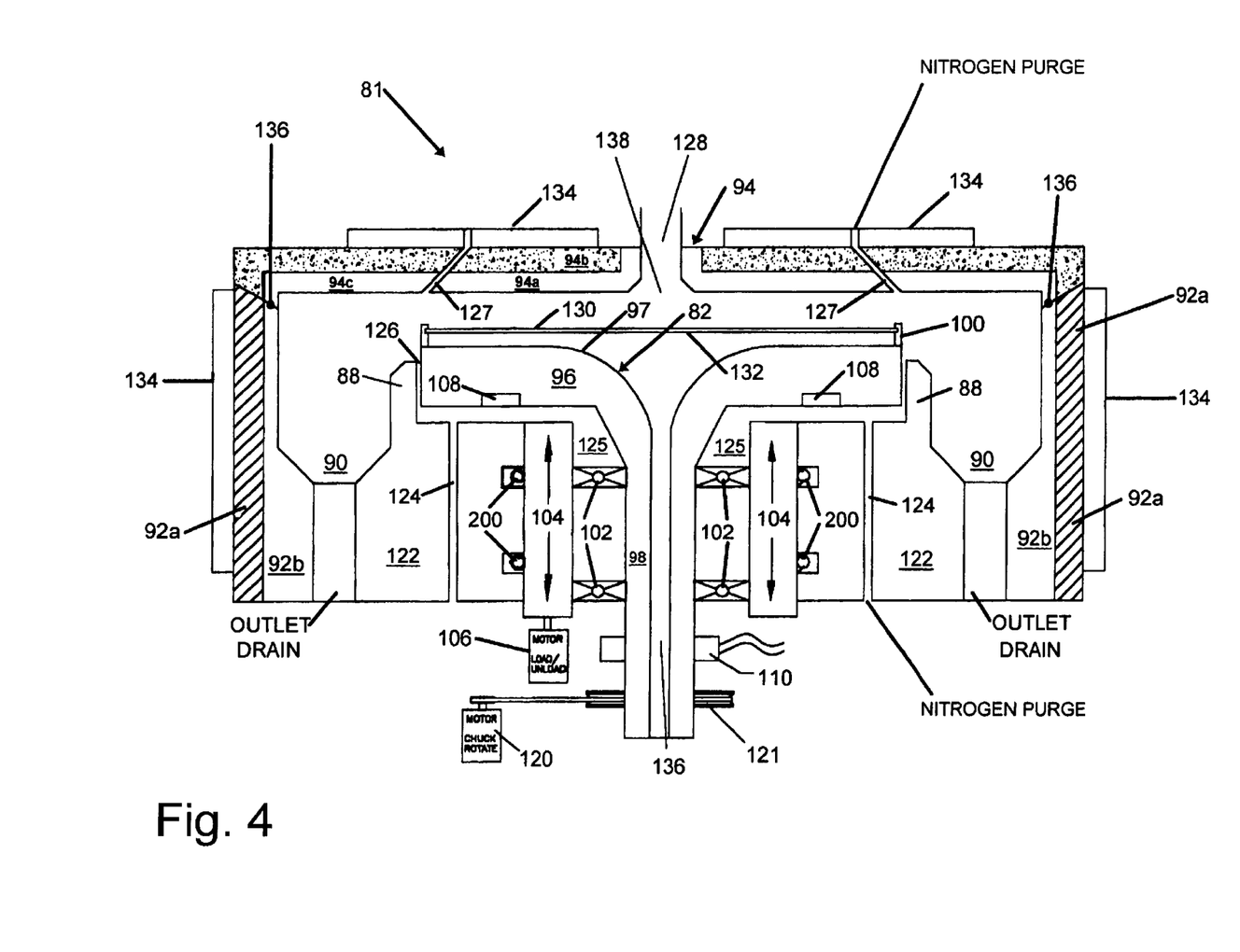
FIG. 4 is a cross-sectional view take along line 4—4 of FIG. 3 in accordance with the present invention.

In FIG. 4, it can be seen that the cleaning apparatus 81 within the enclosure 80 includes a side wall structure 92a, 92b, and a lid assembly 94. The side walls 92a are preferably formed from a conventional material such as aluminum or stainless steel, while the annular liquid drainage bowl 90 composed of outer wall section 92b and inner section 122, is preferably made from a chemical resistant fluoropolymer such as PVDF (polyvinylidene fluoride), teflon (TFE, PFA, FEP), teflon NXT, Halar (ECTFE), or Kel-F (PCTFE). Polysulfone and PEEK may also be used, as well as stainless steel. The lid assembly 94 includes sections 94a, 94b, and 94c. Section 94a lies over the wafer and any particles created by this material will fall directly on the wafer surface. For this reason, it is preferably made from PEEK, teflon PFA, or teflon NXT. Section 94c is preferably made from the same materials as section 92b, but they need not be the same in each component. Section 94b is preferably made from the same materials as section 92a.

In a preferred embodiment of the present invention, the chuck 82 includes an upper platen portion 96 and an integral shaft portion 98. A wafer 30 is held above the upper surface 97 of the platen portion 96 by pins 100. Preferably, at least 3 notched pins 100 are used to hold the wafer 30 securely to the chuck 82. A flow channel is provided within the shaft portion 98 and platen portion 96 for the passage of fluids, as will be discussed in greater detail subsequently.

The chuck 82 is supported for rotation by bearing assemblies 102 which engage the shaft portion 98 of the chuck 82. These bearings 102 are supported for up and down vertical movements by carriage 104 for the purpose of loading and unloading the wafer 30 from the chuck 82. The up and down movement of the carriage 104 is controlled by a motor 106.

Optionally attached to the underside of the platen portion 98 are a plurality of ultrasonic transducers 108. As used herein "plurality" means two or more transducers. Alternatively or additionally, an ultrasonic transducer 110 can be coupled to the lower end of the shaft portion 98 of the chuck 82, or in other locations. The entire chuck 82 is rotated by a motor 120 with the use of a drive belt and pulley 121, or by direct connection with motor 120, or by some other suitable transmission mechanism. A frame (not shown) is provided and is preferably connected to the side wall structure 92 of the enclosure 80. The frame includes a purge vent 124 into which a nitrogen (N2) purge can flow. The nitrogen flows through the vent 124 into the space 125 between the drainage bowl 122 and chuck 82. An upper portion of the drainage bowl 122 forms the annular lip 88 which surrounds the perimeter of the platen portion 96 of the chuck 82. Preferably, the lip 88 is provided with a relatively sharp edge 126. When nitrogen flows through vent 124, it divides into two main routes. Some of the nitrogen flows through the space 125, and down through the bearing assemblies 102. This flow prevents particles generated in the bearings from contaminating the process chamber. The other component of nitrogen flowing from vent 124 flows around the platen portion 96 of the chuck 82 and over the sharp edge 126 of the annular lip 88. This prevents liquid from flowing into the space 125 and, instead, urges any liquid towards the drain portion 90.

$N_2$ purging is also provided in the lid assembly 94, through an annular shaped passageway 127, preferably exiting at or near the outer diameter of wafer 30. This purge aids in the reduction or elimination of recirculation eddies (caused by rotation) which can contaminate the edge of the water.

The lid 94 is provided with a steam inlet 84. This allows a vapor phase to be applied to an upper or "active" surface 130 (i.e. the surface that has integrated circuit devices being formed thereon) of the wafer 30 and a aqueous or liquid phase be applied to the back side surface 132 of the wafer 30. Preferably, heat traces 134 (e.g. electrical resistance tape or blankets) are used to maintain an elevated temperature on the sidewalls structure 92a and the lid 94b to prevent condensation, particularly on components 94a,c and 92b.

In operation, the lid 94 is lifted and the chuck 82 is caused to move in a vertical direction by the carriage 104 moving under the controller motor 106. A wafer is then placed on the platen portion 96 of the chuck 82 by the robot arm assembly, and the pins 100 engage the edge of the wafer 30. The chuck 82 is then retracted within the chamber 48 and the lid 94 is closed and sealed via seals 136. The chuck 82 is caused to rotate by motor 120 and transmission 121, the purge nitrogen is caused to flow through vent 124, and between 94a and 94c, deionized water is caused to flow through the channel 136 of the chuck 82 and through the liquid inlet 84, and steam is introduced to the surface 130 of the wafer 30 through the steam inlet 138. The water flowing on the back side 132 of the wafer 30 draws heat away from the wafer (i.e. provides a "heat sink") and also cleans the back side of the wafer 30. The water flows from the center of the wafer 30 to the edges of the wafer and is then directed by the lip 126 and the nitrogen purge into the drain 90 of the system. The steam entering nozzle area 138 impinges on the wafer 30 near the center, and is quickly condensed as it proceeds toward the outer diameter by the relatively cool wafer. The rotation of the chuck 82 causes the condensed steam to spin off of the surface of the wafer and to flow into the drain 90. The rotation enhances the heat and mass transfer processes required to provide significant condensation for effective cleaning and purging of the wafer surface.

Figure 5A:
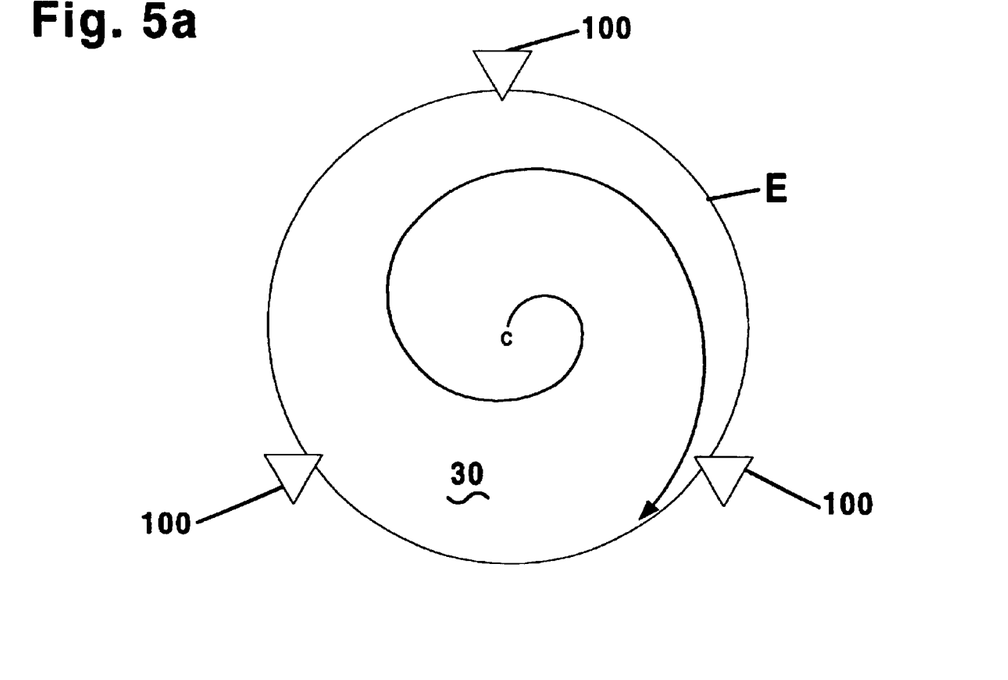
FIGS. 5a and 5b illustrate the movement of a fluid over the surface of a semiconductor wafer as the wafer is rotated both with reference to ground (FIG. 5a) and with respect to the wafer (FIG. 5b) in accordance with the present invention.

In FIG. 5a, the flow of fluid with respect to "ground" illustrates a spiral path 140 of the cleaning fluid from the center C to the edge E of wafer 30. That is, steam released onto the active surface of the wafer is condensed on the wafer surface and spirals or otherwise moves from the center C towards the edge E of the wafer. This movement of the cleaning fluid is caused, to some extent, by the fluid build up of condensate on the active surface of the wafer and, to a greater extent, by the rotation of the wafer 30. The wafer 30 is held by the pins 100 to enable this rotation.

Figure 5B:
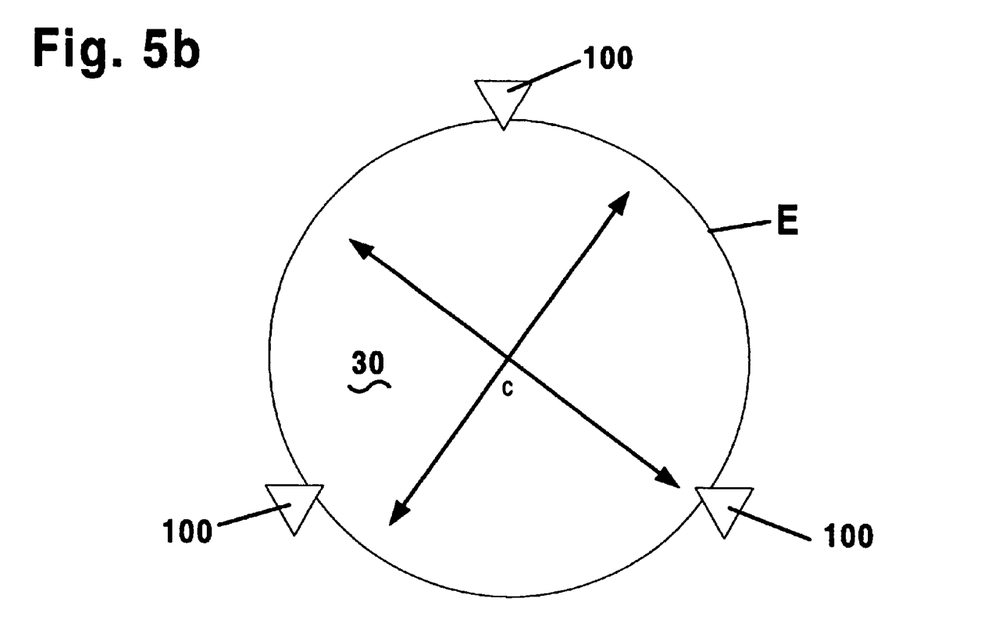

FIG. 5b is the same view of the wafer 30 as in FIG. 5a, except the movement of the cleaning fluid 142 is shown with respect the surface of the wafer 30. As can be seen, the fluid 142 moves essentially radially from the center C to the edge E of the wafer, when taken from the perspective of the surface of the wafer 30. This radial movement is, again, due to the fluid accumulation during the condensation from the center C outward of the wafer 30, and due to centrifugal forces created by the rotation of the wafer 30. The wafer 30 is held by the pins 100, as discussed previously, to enable this rotation.

While the FIGS. 5a and 5b illustrate the movement of the cleaning fluid from central regions of the wafer 30 towards the edge regions of wafer 30, it is to be understood that the fluid paths 140 and 142 are for conceptual purposes only. The actual paths will vary dependent upon a variety of factors including the wetting of the wafer, irregularities in the wafer surface, droplet formation, etc. The key, however, is that the cleaning fluid tends to flow across the surface of the wafer and to be spun off of the edges of the wafer as it travels from the central regions of the wafer to the edge of the wafer.

Figure 6:
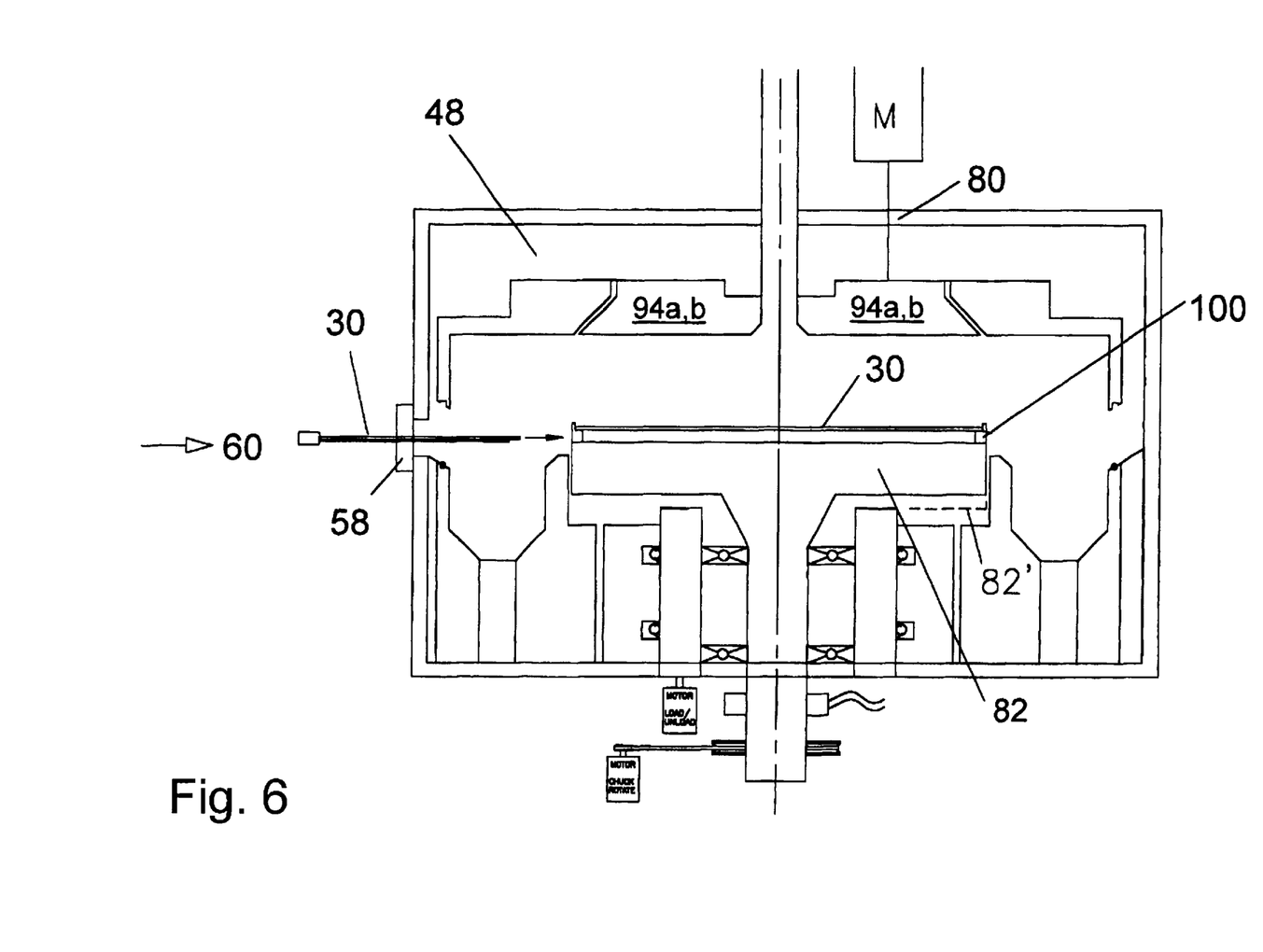
FIG. 6 is a schematic view of a cleaning chamber of the present invention illustrating the loading and unloading of a wafer.

In FIG. 6, the apparatus is illustrated in a pictorial fashion to facilitate a description of the loading and unloading of wafers. Assuming that the gate valve 58 is opened, the robot arm 60 places a wafer 30 within the chamber in alignment with the chuck 82. At this point in time the chuck 82 is in a lower or retracted position 82' such that the wafer 30 is held above the chuck 82. The chuck 82 is then raised such that pins 100 engage with the edge of the wafer 30 to firmly hold the wafer 30 to the chuck 82. Typically, at this time, the robot arm 60 is withdrawn and the gate valve 58 is then closed. The chuck 82 is then lowered again to 82' such that the lid 94 can be closed over the chuck. After cleaning, the process is reversed to remove the wafer 30 from the pins 100 of the chuck 82.

Figure 7A:
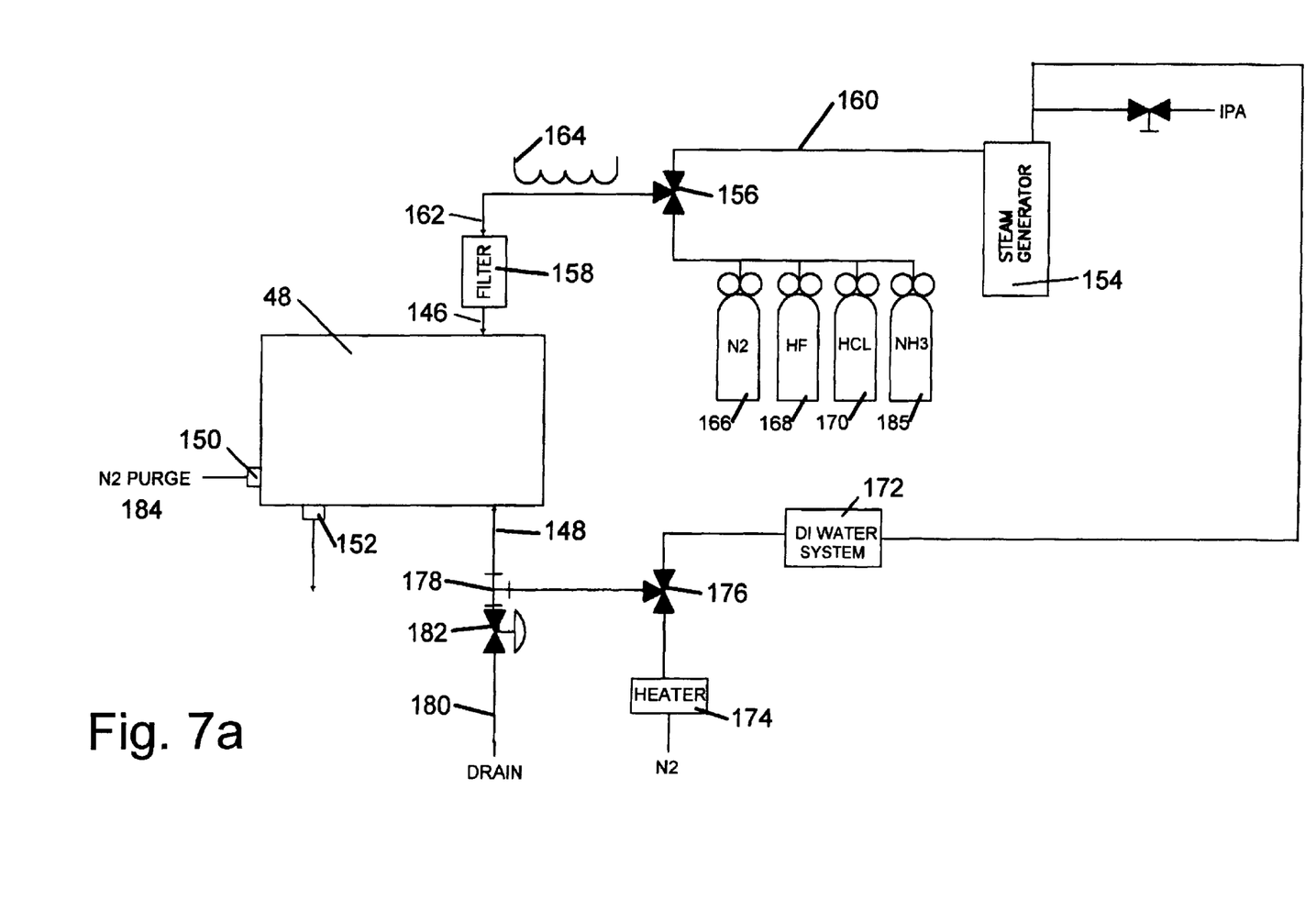
FIG. 7a is a diagram illustrating the vapor phase delivery system and liquid phase delivery system of the present invention.

FIG. 7a illustrates both a stand-alone flat workpiece cleaning system and the support systems for a cleaning chamber 48 of a cluster tool system. The chamber 48 has a number of inlets 146, 148, and 150, and an outlet or drain 152. There may also be a gaseous pressure outlet or drain (not shown here) for the N2 purge gasses. A steam generator 154 is preferably coupled to the inlet 146 by a valve system 156 and a filter 158. A preferred steam generator 154 construction is disclosed in U.S. Pat. No. 5,063,609 the disclosure of which is incorporated herein by reference for all purposes. Preferably, the tubing 160 coupling the steam generator 154 to the valve system 156, the valve system 156, and tubing 162 coupling the valve system 156 to the filter 158 are made from PFA Teflon to minimize contamination of the steam. Alternatively, these aforementioned components can be made of teflon FEP, teflon NXT, PEEK, or PVDF. Heat traces 164 are preferably provided around at least tubing 162, and preferably tubing 160, valve assembly 156, and filter 158, to prevent the steam from condensing. Thermal insulation (not shown) may also be utilized on the aforementioned components. Various gas tanks such as a gas tank 166 for $N_2$, a gas tank 168 for HF, a gas tank 170 for HCL, and a gas tank 185 for $NH_3$ are coupled to the valve system 156 such that one or more of these gasses can be mixed with the steam generated by steam generator 154.

The filter 158 forms an important part of the purification of the steam created by steam generator 154. While steam, in general, is a very clean form of water, it can still carry minute particles, aerosols, and impurities which can be deposited upon the active wafer surface. The present invention preferably employs a 100% Teflon microporous filter, such a filter made by Millipore Corporation as model number Chem-Line II PF40. The steam is filtered in its gaseous phase, and then is applied to the active wafer surface via the inlet 146 of the chamber 48. This is very advantageous since filtering efficiency is much higher for the gaseous phase of water versus the liquid phase of water. This filtering of the gaseous phase therefore ensures a very high purity steam being applied to the active surface of the, wafer.

A source of deionized (DI) water 172 and a source of heated $N_2$ purge gas 174 are coupled to inlet port 148 by valve 176 and tee 178. The DI water 172 is applied to the backside of the wafer 30 (not shown) to both wash the backside of the wafer and to carry heat away from the wafer, i.e. to provide a "heat sink." The heated $N_2$ purge gas 174, coupled with nitrogen from tank 166 fed through heated components valve 156, line 162, and filter 158, is used to dry the wafer after cleaning. A drain is coupled to the valve assembly 178 by a drain valve 182. An additional (unheated) $N_2$ purge 184 is coupled to the inlet 150.

Figure 7B:
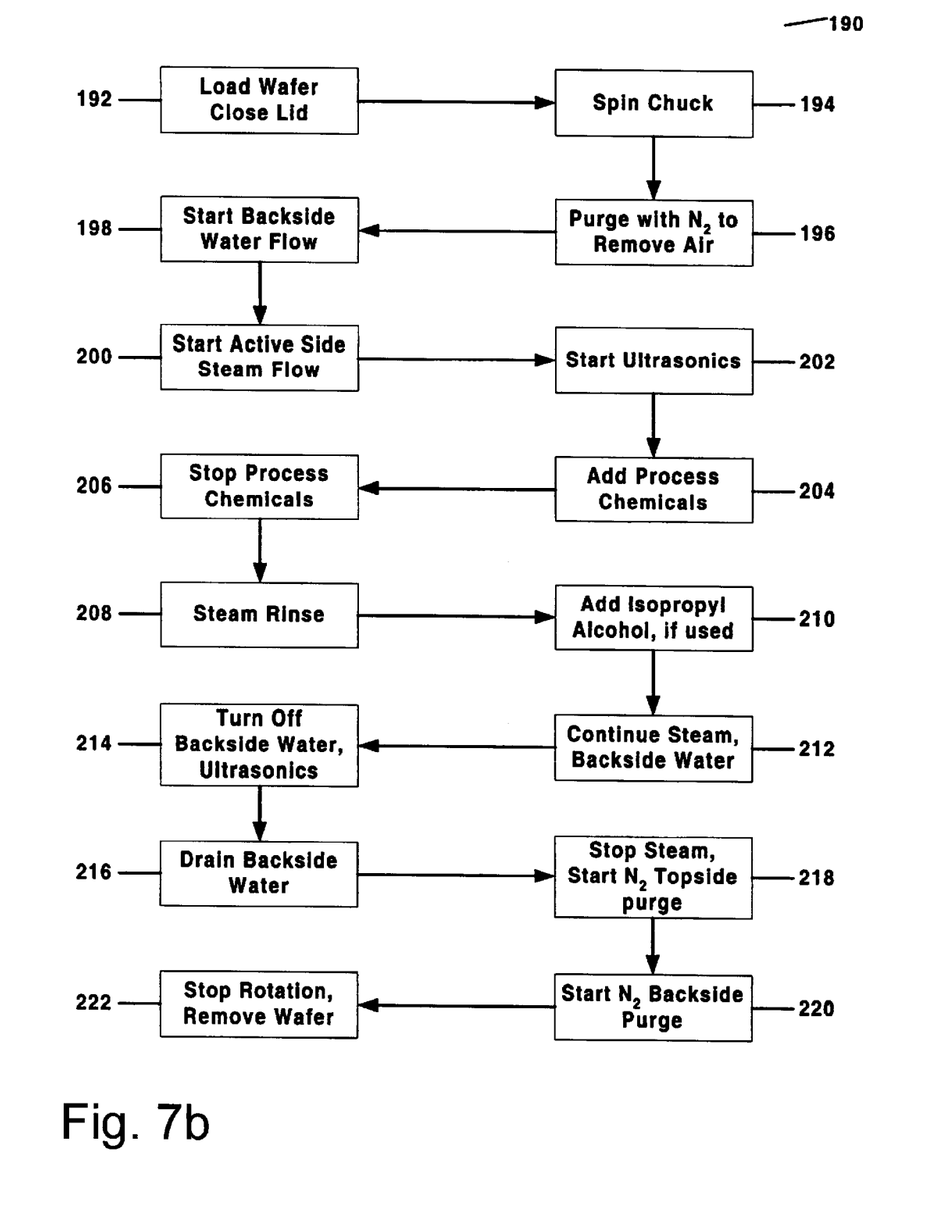
FIG. 7b illustrates a process flow of the present invention.

In FIG. 7b, a process 190 for cleaning flat workpieces such as semiconductor wafers, disk drive platters, optical blanks, etc. begin at an operation 192 wherein a wafer is loaded into the cleaner and the lid is closed. In an operation 194, the chuck is then caused to rotate to rotate the loaded wafer. The cleaner is purged with N2 gas to force out air, $CO_2$, etc. in an operation 196. The backside water flow is then started in an operation 198. Subsequently, the front or "active side" steam flow is stared in an operation 200. Ultrasonics (if any) can then be started in an operation 202. Any process chemicals (e.g. HCL, HF, HBr, $NH_3$) used to enhance the cleaning process can be added in an operation 204. There is no requirement, however, that any process chemicals be used. If process chemicals are used, they are then stopped in an operation 206. Operation 208 then performs a steam rinse to remove any remaining process chemicals. Optionally, isopropyl alcohol (IPA) is then added to the water used to generate the steam in an operation 210. While IPA is useful in the cleaning process under many circumstances, it may not always be desirable to add EPA to the steam generator water. Both sides of the wafer then continue to be cleaned in an operation 212. That is, the top or active side of the wafer continues to be cleaned by the steam and steam condensate, while the bottom side of the wafer continues to be cleaned by the DI water. Such cleaning can continue, for example, for about 30 seconds.

After the main portion of the cleaning cycle has been completed, the ultrasonics are turned off and the back side water flow is stopped in an operation 214. The cleaner is then drained of the cleaning fluids that were accumulated during the back side rinsing of the wafer in an operation 216. In an operation 218, the top side steam is stopped, and a top side N2 purge is started. Subsequently, a backside N2 purge with heated N2 gas is commenced in an operation 220. After the wafer (or other workpiece) is dry, an operation 222 terminates the purges, stops the rotation of the wafer, opens the lid, and removes the clean, dry wafer from the cleaning system.

While this invention has been described in terms of several preferred embodiments, it is contemplated that alternatives, modifications, permutations and equivalents thereof will become apparent to those skilled in the art upon a reading of the specification and study of the drawings. It is therefore intended that the following appended claims include all such alternatives, modifications, permutations and equivalents as fall within the true spirit and scope of the present invention.

What is claimed is:

1. A method for manufacturing an integrated circuit comprising:
    selecting a wafer having an active surface and a backside surface;
    subjecting said active surface of said wafer to at least one of a plurality of processes selected from a group including thermal oxidation, deposition, patterning, doping, planarization, and etching processes;
    cleaning said wafer before said at least one of a plurality of processes, further comprising:
        rotating said wafer;
        applying a vapor phase to said active surface at a first temperature; and
        while applying said vapor phase to said active surface, applying a liquid to said backside surface at a second temperature lower than said first temperature.

2. A method for manufacturing an integrated circuit as recited in claim 1 wherein said vapor phase comprises steam.

3. A method for manufacturing an integrated circuit as recited in claim 2 wherein said vapor phase comprises isopropyl alcohol.

4. A method for manufacturing an integrated circuit as recited in claim 2 wherein said vapor phase comprises at least one of ammonia gas, hydrogen chloride gas, hydrogen bromide gas, and hydrogen fluoride gas.

5. A method for manufacturing an integrated circuit as recited in claim 1 wherein said vapor phase is filtered prior to applying to said active surface.

6. A method for manufacturing an integrated circuit as recited in claim 1 further comprising:
    cutting said wafer into a plurality of integrated circuit die; and
    packaging said integrated circuit die to form a plurality of integrated circuits.

7. A method for manufacturing an integrated circuit comprising:
    selecting a wafer having an active surface and a backside surface;
    subjecting said active surface of said wafer to at least one of a plurality of processes selected from a group including thermal oxidation, deposition, patterning, doping, planarization, and etching processes;
    cleaning said wafer during said at least one of a plurality of processes, further comprising:
        rotating said wafer;
        applying a vapor phase to said active surface at a first temperature; and
        while applying said vapor phase to said active surface, applying a liquid to said backside surface at a second temperature lower than said first temperature.

8. A method for manufacturing an integrated circuit as recited in claim 7 wherein said vapor phase comprises steam.

9. A method for manufacturing an integrated circuit as recited in claim 8 wherein said vapor phase comprises isopropyl alcohol.

10. A method for manufacturing an integrated circuit as recited in claim 8 wherein said vapor phase comprises at least one of ammonia gas, hydrogen chloride gas, hydrogen bromide gas, and hydrogen fluoride gas.

11. A method for manufacturing an integrated circuit as recited in claim 7 wherein said vapor phase is filtered prior to applying to said active surface.

12. A method for manufacturing an integrated circuit as recited in claim 7 further comprising:
    cutting said wafer into a plurality of integrated circuit die; and
    packaging said integrated circuit die to form a plurality of integrated circuits.

13. A method for manufacturing an integrated circuit comprising:
    selecting a wafer having an active surface and a backside surface;
    subjecting said active surface of said wafer to at least one of a plurality of processes selected from a group including thermal oxidation, deposition, patterning, doping, planarization, and etching processes;
    cleaning said wafer after said at least one of a plurality of processes, further comprising:
        rotating said wafer;
        applying a vapor phase to said active surface at a first temperature; and
        while applying said vapor phase to said active surface, applying a liquid to said backside surface at a second temperature lower than said first temperature.

14. A method for manufacturing an integrated circuit as recited in claim 13 wherein said vapor phase comprises steam.

15. A method for manufacturing an integrated circuit as recited in claim 14 wherein said vapor phase comprises isopropyl alcohol.

16. A method for manufacturing an integrated circuit as recited in claim 14 wherein said vapor phase comprises at least one of ammonia gas, hydrogen chloride gas, hydrogen bromide gas, and hydrogen fluoride gas.

17. A method for manufacturing an integrated circuit as recited in claim 13 wherein said vapor phase is filtered prior to applying to said active surface.

18. A method for manufacturing an integrated circuit as recited in claim 13 further comprising:
    cutting said wafer into a plurality of integrated circuit die; and
    packaging said integrated circuit die to form a plurality of integrated circuits.

* * * * *